(12) United States Patent
Hayashi et al.

(10) Patent No.: US 7,902,555 B2
(45) Date of Patent: Mar. 8, 2011

(54) SEMICONDUCTOR DEVICE (75) Inventors: Tetsuya Hayashi, Yokosuka (JP);
Masakatsu Hoshi, Yokohama (JP);
Hideaki Tanaka, Yokohama (JP);
Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 284 days.

(21) Appl. No.: 12/325,377

(22) Filed: Dec. 1, 2008

(65) Prior Publication Data

US 2009/0140264 A1  Jun. 4, 2009

(30) Foreign Application Priority Data

Dec. 4, 2007  (JP) ................................ 2007-313110
Sep. 30, 2008 (JP) ................................ 2008-255061

(51) Int. Cl.
*H01L 29/15* (2006.01)
*H01L 31/0312* (2006.01)

(52) U.S. Cl. .................. 257/77; 257/192; 257/E29.104; 257/E29.255

(58) Field of Classification Search .............. 257/11, 257/12, 51, 77, 85, 90, 94, 96, 97, 183, 192, 257/194, 196, 199, 200, E51.01, E51.011–E51.018, 257/E29.104, E33.016, E33.021, E29.255
See application file for complete search history.

(56) References Cited

U.S. PATENT DOCUMENTS

| 2007/0252172 A1 | 11/2007 | Hayashi et al. |
| 2007/0252173 A1 | 11/2007 | Hayashi et al. |

FOREIGN PATENT DOCUMENTS

| EP | 1519419 (A2) | 3/2005 |
| JP | 7-106558 (A) | 4/1995 |
| JP | 2003-318398 A | 11/2003 |
| KR | 10-2007-0106439 (A) | 11/2007 |

*Primary Examiner* — Davienne Monbleau
*Assistant Examiner* — Monica D Harrison
(74) *Attorney, Agent, or Firm* — Foley & Lardner LLP (57) ABSTRACT

A hetero semiconductor corner region, which is a current-concentration relief region that keeps a reverse bias current from concentrating on the convex corner, is arranged in a hetero semiconductor region. Thereby, a current concentration on the convex corner can be prevented. As a result, an interrupting performance can be improved at the time of interruption, and at the same time, the generation of the hot spot where in a specific portion is prevented at the time of conduction to suppress deterioration in a specific portion, thereby ensuring a long-term reliability. Further, when the semiconductor chip is used in an L load circuit or the like, for example, at the time of conduction or during a transient response time to the interrupted state, in an index such as a short resistant load amount and an avalanche resistant amount, which are indexes of a breakdown tolerance when overcurrent or overvoltage occurs, the current concentration on a specific portion can be prevented, and thus, these breakdown tolerances can also be improved.

20 Claims, 12 Drawing Sheets

SEMICONDUCTOR DEVICE

BACKGROUND OF THE INVENTION

1. Field of the Invention

The present invention relates to a semiconductor device having a heterojunction interface.

2. Description of the Related Art

Conventionally, a semiconductor device disclosed in Japanese Patent Application Laid-open No. 2003-318398 has been known. According to the semiconductor device, an $N^-$-type polycrystalline silicon region is formed to contact one main surface of a semiconductor body including an $N^-$-type silicon carbide epitaxial region on an $N^+$-type silicon carbide substrate. A heterojunction interface is formed between the epitaxial region and the polycrystalline silicon region. Adjacently to the heterojunction interface, a gate electrode is formed via a gate insulating film. The polycrystalline silicon region is connected to a source electrode, and a bottom surface of the silicon carbide substrate is formed thereon with a drain electrode.

When a circuit is configured by arranging the semiconductor device in plural and in parallel, polycrystalline silicon regions of adjacent semiconductor devices are arranged separate with each other. Therefore, a level difference of the heterojunction interface is generated at the end of the heterojunction interface. As a result, when a reverse bias voltage is applied such as at the time of interruption, a leakage current concentration occurs in a region where the level difference is generated as compared to the other heterojunction interface region. Thus, there is a problem that an interruption characteristic is decreased as a semiconductor device.

The present invention has been achieved to solve the problem of the related art, and an object of the present invention is to provide a semiconductor device having a high interruption characteristic.

SUMMARY OF THE INVENTION

According to the present invention, a heterojunction interface that contacts a gate insulating film comprises a corner. A current-concentration relief region is formed. The current-concentration relief region decreases current generated at the corner than current generated at the other heterojunction interface position contacting the gate insulating film.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

DETAILED DESCRIPTION OF THE PREFERRED EMBODIMENTS

Preferred embodiments of the present invention will be explained below with reference to the accompanying drawings.

First Embodiment

A semiconductor device according to a first embodiment of the present invention is described with reference to FIG. 1 to FIG. 3.

Structure

Figure 1:
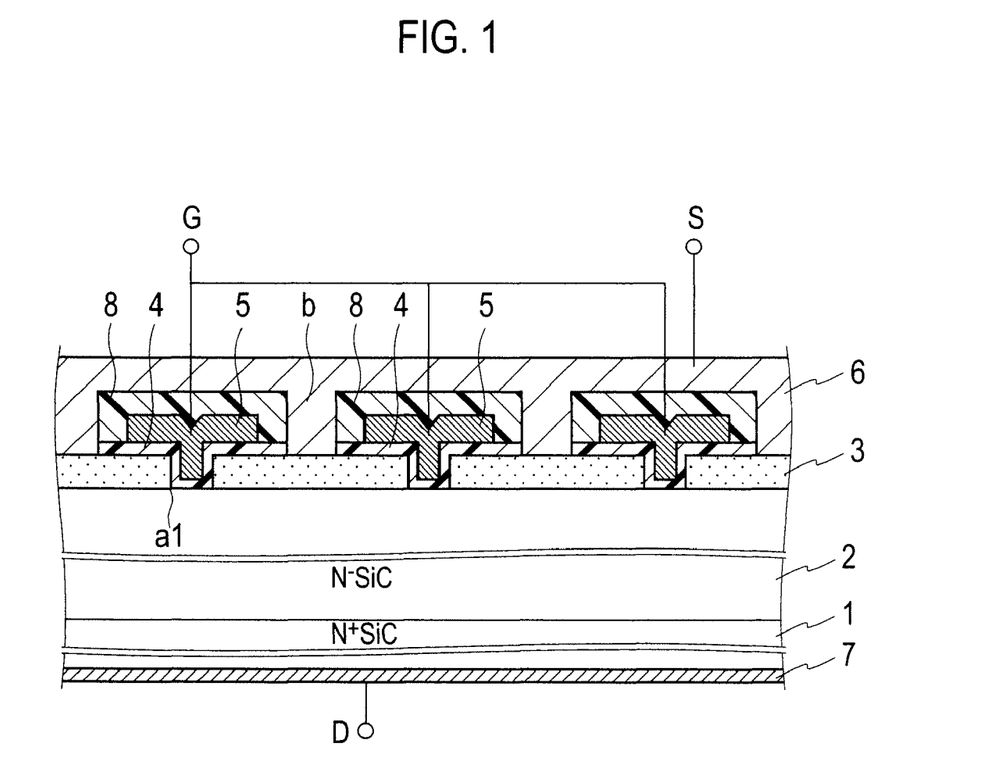
FIG. 1 is a cross-sectional view of a semiconductor device according to a first embodiment of the present invention.

FIG. 1 shows a cross-sectional structure in which semiconductor devices according to a first embodiment of the present invention are repeatedly formed, and as one example, shows a case that three semiconductor devices are aligned. In the first embodiment, as one example, a case that silicon carbide is a substrate material is described. According to the first embodiment, as shown in FIG. 1, an $N^+$-type substrate region 1 of which the polytype of the silicon carbide is 4H type is formed thereon with an $N^-$-type drift region 2. A hetero semiconductor region 3 formed of N-type polycrystalline silicon, for example, is formed to contact a main surface facing a junction surface with the substrate region 1 in the drift region 2. That is, the N-type hetero semiconductor region 3 is formed to contact the N-type (first conductivity type) semiconductor body formed of the substrate region 1 and the drift region 2. A junction portion between the drift region 2 and the hetero semiconductor region 3 is formed by heterojunction by materials of which the band gap between the silicon carbide and the polycrystalline silicon differs, and at a heterojunction interface, an energy barrier exists.

A gate insulating film 4 formed of a silicon oxide film, for example, is formed to contact the heterojunction interface between the hetero semiconductor region 3 and the drift region 2. That is, a hole that reaches the drift region 2 is placed in the hetero semiconductor region 3, and the gate insulating film 4 is formed on a top surface of the hetero semiconductor region 3, side surfaces of the hole, and a surface of the hole of the drift region 2. Out of the heterojunction surface between the hetero semiconductor region 3 and the drift region 2, a portion contacting the gate insulating film 4 is called a "heterojunction driving end a1". On the gate insulating film 4, a gate electrode 5 is formed. On an opposite surface facing the heterojunction surface between the hetero semiconductor region 3 and the drift region 2, a source electrode 6 is formed through a contact hole b to provide an ohmic connection. In the substrate region 1, a drain electrode 7 is formed to provide an ohmic connection. An interlayer insulating film 8 is formed to insulate between the gate electrode 5 and the source electrode 6.

Figure 2:
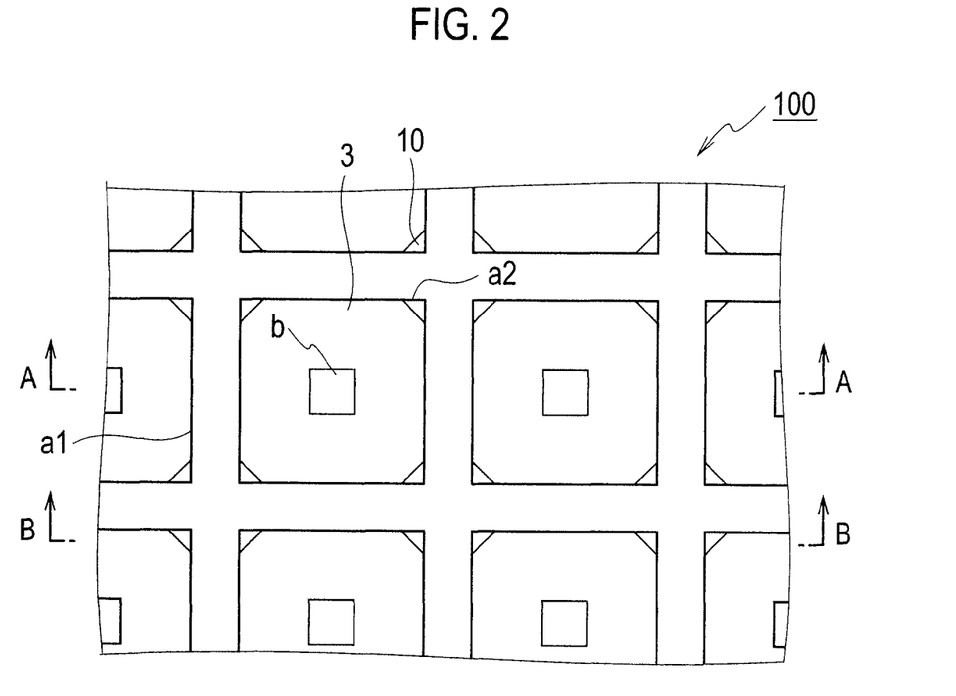
FIG. 2 is a surface view of a semiconductor device according to a first embodiment of the present invention.
Figure 3:
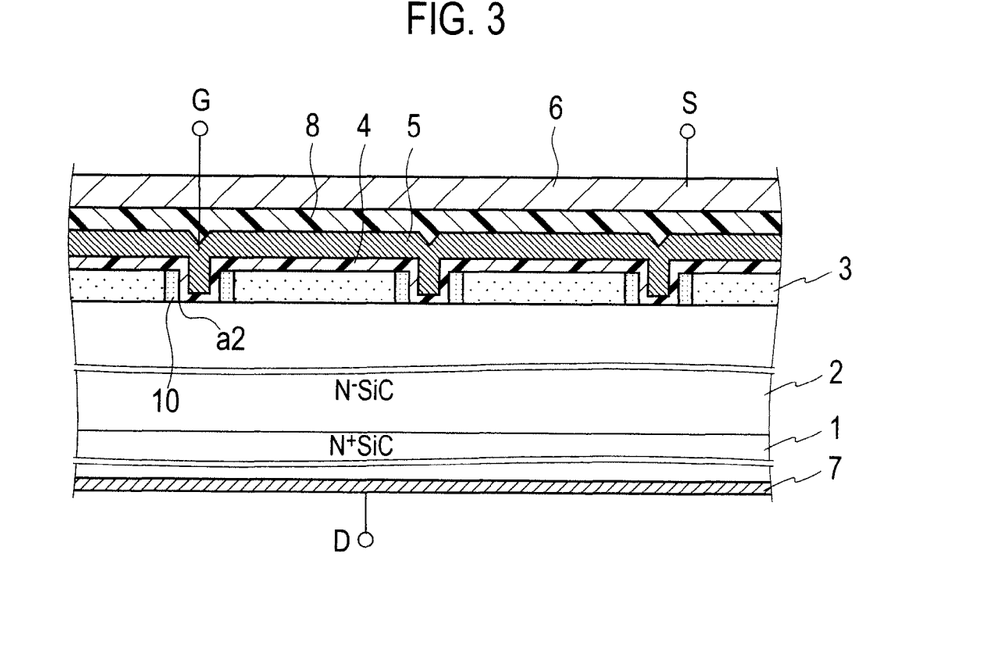
FIG. 3 is a cross-sectional view of a semiconductor device according to a first embodiment of the present invention.

A plurality of base cell structures of the semiconductor device configured by each of the regions 1 to 8 are arranged as in a surface shape shown in FIG. 2, for example, to form a semiconductor chip 100. In FIG. 2, to easily understand the surface arrangement of the heterojunction driving end a1 shown in FIG. 1, illustrations of the gate insulating film 4, the gate electrode 5, the source electrode 6, and the interlayer insulating film 8 are omitted. A cross-sectional structure taken along A-A in FIG. 2 is the cross-sectional structure shown in FIG. 1. As shown in FIG. 2, in the first embodiment, a groove (hole) for forming the gate insulating film 4 placed in the hetero semiconductor region 3 is a linear shape extending in right and left directions and up and down directions in the plan of the paper, and the surface shape of the hetero semiconductor region 3 is in a square cell shape. Thus, the heterojunction driving end a1 has a convex corner. However, at the four corners of the hetero semiconductor region 3, i.e., portions contacting the convex corner of the heterojunction driving end a1, there are formed hetero semiconductor corner regions 10 formed of P⁻-type polycrystalline silicon of which the conductivity type is opposite to and the impurity density is smaller than those of the hetero semiconductor region 3, for example. That is, the hetero semiconductor corner regions 10 contacting the convex corners are formed in the hetero semiconductor region 3, and configures a heterojunction driving end a2 so that the hetero semiconductor corner regions 10 contacts the gate insulating film 4 and the drift region 2, respectively, as shown in a cross-sectional structure of the four corners of the hetero semiconductor region 3 in FIG. 3, which shows a cross-sectional shape taken along B-B in FIG. 2.

Operation

The operation is described next. In the first embodiment, the semiconductor device is so used that the source electrode 6 is grounded and the drain electrode 7 is applied a positive potential, for example.

First, when the gate electrode 5 is grounded or a negative potential, for example, an interrupted state is held. That is, this is due to the fact that at the heterojunction interface between the hetero semiconductor region 3 and the hetero semiconductor connecting region 10, and the drift region 2, the energy barrier for a conduction electron is formed. At this time, in the first embodiment, at the four corners of the hetero semiconductor region 3 in a square cell shape, the hetero semiconductor corner regions 10 formed of P⁻-type polycrystalline silicon are arranged. Thus, even when the convex corners are provided, a large leakage current is not generated. As a result, the interruption characteristic provided in the base cell structure shown in FIG. 1 can also be obtained in the semiconductor chip 100. The reason for this is that when the hetero semiconductor corner regions 10 formed of P⁻-type polycrystalline silicon are arranged to form the heterojunction driving end a2 at the four corners of the hetero semiconductor region 3, two leakage-current decreasing effects can be obtained. First reason for this is that the hetero semiconductor corner region 10 is opposite in conductivity type to the hetero semiconductor region 3, and thus, the energy barrier for the conduction electron, formed at the heterojunction interface between the hetero semiconductor corner region 10 and the drift region 2, is formed to be higher than the energy barrier formed at the heterojunction interface between the hetero semiconductor region 3 and the drift region 2. For example, when the conductivity type of the drift region 2 is N-type, the energy barrier formed at the heterojunction interface becomes higher in order of conductivity type of: P⁺-type, P⁻-type, intrinsic, N⁻-type, and N⁺-type. Second reason for this is that since the impurity density of the hetero semiconductor corner region 10 is smaller than that of the hetero semiconductor region 3, a resistance of the hetero semiconductor corner region 10 is larger than that of the hetero semiconductor region 3, and as a result, a resistance at the convex corner is large. Due to these reasons, according to the first embodiment, the interrupting performance can be further improved than that of the conventional technique.

Next, when a positive potential is applied to the gate electrode 5 to shift from the interrupted state to the conducting state, the heterojunction driving end a1 of the hetero semiconductor region 3 and a surface layer portion of the drift region 2 where the gate electric field applies via the gate insulating film 4 are formed thereon with an accumulation layer of electrons. As a result, in the hetero semiconductor region 3 and the surface layer portion of the drift region 2, a potential becomes to be the one that a free electron can be present, which makes the energy barrier extending to a side of the drift region 2 steep. Thereby, a thickness of the energy barrier is decreased. As a result, an electron current is conducted. At this time, in the first embodiment, the hetero semiconductor corner regions 10 are arranged in the convex corners, the energy barrier for the conduction electron, formed at the heterojunction interface, is formed to be higher than the other portions, and a resistance in a conductive path is formed to be large. Thus, the current does not concentrate on the convex corners, and most of the current that passes at the time of conduction is passed nearly uniformly in the base cell formed of the regions 1 to 8 arranged in plural and in parallel. As a result, a semiconductor chip 100 in which the hot spot where a specific location generates heat is not easily generated can be obtained. That is, in contrast to a case that the hetero semiconductor corner region 10 is not arranged, even when the conduction and the interruption are repeated, a specific location is not easily deteriorated. Thus, it is possible to improve a breakdown tolerance such as a short resistant load amount, and a performance about a long-term reliability as well.

Next, in the first embodiment, to shift from the conducting state to the interrupted state, when the gate electrode 5 is again grounded, an accumulated state of the conduction electron formed at the heterojunction interface between the hetero semiconductor region 3 and the drift region 2 is released, and thus, tunneling in the energy barrier is stopped. Thereafter, when passing of the conduction electron from the hetero semiconductor region 3 to the drift region 2 is stopped, and the conduction electron remaining in the drift region 2 is depleted as a result of being passed to the substrate region 1, a depletion layer expands from the heterojunction portion to a side of the drift region 2, resulting in an interrupted state.

In the first embodiment, for example, a reverse conduction (back-flow operation) in which the source electrode 6 is grounded and a negative potential is applied to the drain electrode 7 can also be possible. For example, when the source electrode 6 and the gate electrode 5 are grounded and a predetermined positive potential is applied to the drain electrode 7, the energy barrier for the conduction electron vanishes and the conduction electron passes from the side of the drift region 2 to the side of the hetero semiconductor region 3, resulting in a reverse conducting state. At this time, the conduction is achieved only by the conduction electron without hole injection, and thus, a loss caused by a reverse recovery current at the time of transferring from the reverse conducting state to the interrupted state is also small. Alternatively, the gate electrode 5 can be used as a control electrode without being grounded. At the time of a reverse conduction (flow-back operation), in the first embodiment, the current does not concentrate on the convex corners. Most of the current that passes at the time of reverse conduction is passed nearly uniformly in the base cell structure formed of the regions 1 to 8 arranged in plural and in parallel, and thus, the current is not concentrated on a specific portion.

Thus, the hetero semiconductor corner region 10, which is the current-concentration relief region that keeps a reverse bias current from concentrating on the convex corner, is arranged in the hetero semiconductor region 3, and thereby, a current concentration on the convex corner can be prevented. As a result, an interrupting performance can be improved at the time of interruption, and at the same time, the generation of the hot spot where in a specific portion is prevented at the time of conduction to suppress deterioration in a specific portion, thereby ensuring a long-term reliability. Further, when the semiconductor chip 100 is used in an L load circuit or the like, for example, at the time of conduction or during a transient response time to the interrupted state, in an index such as a short resistant load amount and an avalanche resistant amount, which are indexes of a breakdown tolerance when overcurrent or overvoltage occurs, the current concentration on a specific portion can be prevented, and thus, these breakdown tolerances can also be improved.

The first embodiment is so described that the hetero semiconductor corner region 10 is P$^-$-type. However, when one of the conditions, i.e., that the energy barrier is high and that the resistance is large, is satisfied so that the current generated in the heterojunction driving end a2 formed by the hetero semiconductor connecting region 10 is smaller than that generated in the heterojunction driving end a1 formed by the hetero semiconductor region 3 of the base cell, the effect of the present invention can be obtained. For example, when the hetero semiconductor region 3 described in the first embodiment is N-type, if a condition other than N$^+$-type, in which the impurity density is higher than that of the hetero semiconductor region 3, is satisfied, the effect can be exhibited at least. FIG. 2 exemplifies a case that the surface shape of the hetero semiconductor corner region 10 is in a triangle shape. However, as long as the convex corner can be contacted, the surface shape of the hetero semiconductor corner region can take any shape such as a square shape and a sector shape.

Second Embodiment

Figure 4:
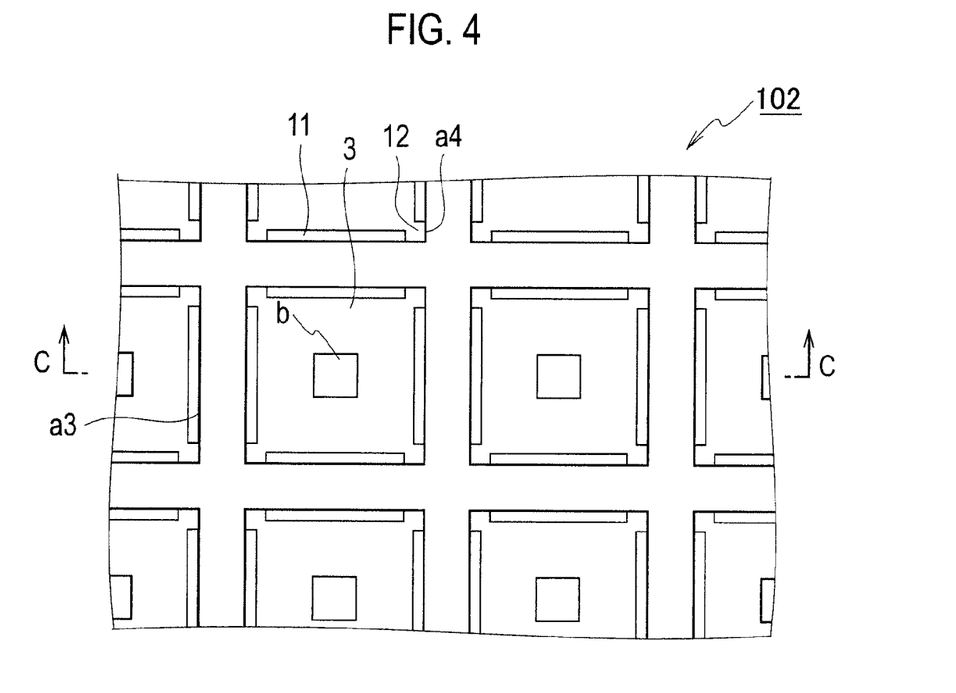
FIG. 4 is a surface view of a semiconductor device according to a second embodiment of the present invention.
Figure 5:
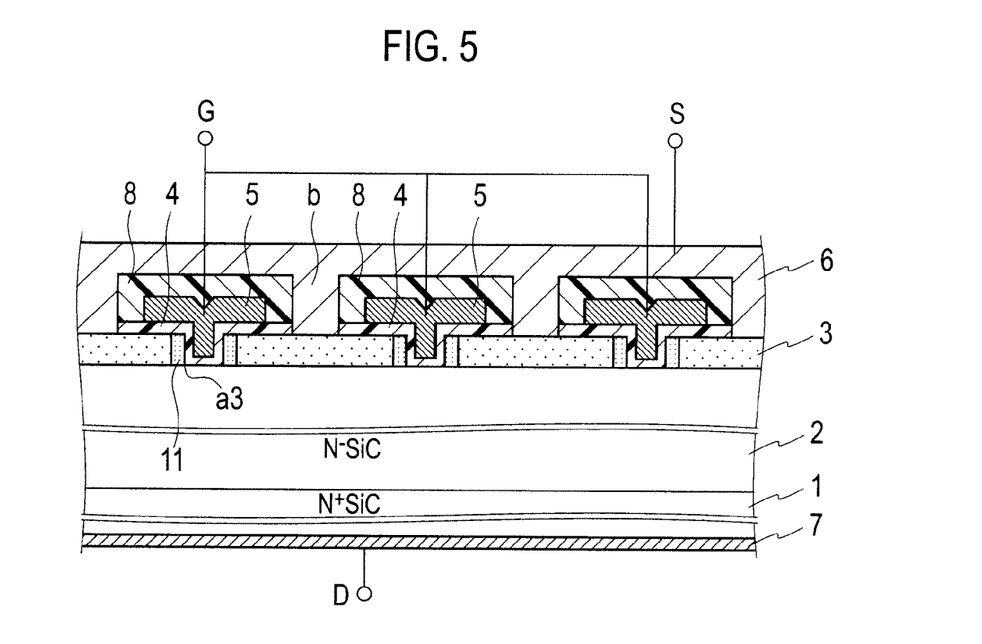
FIG. 5 is a cross-sectional view of a semiconductor device according to a second embodiment of the present invention.

A semiconductor device according to a second embodiment of the present invention is described with reference to FIGS. 4, 5.

Structure

In the first embodiment, the hetero semiconductor corner region 10 contacting the convex corner is formed in the hetero semiconductor region 3. However, for example, as a second embodiment of the present invention, as shown in FIG. 4 and FIG. 5 showing a cross-sectional structure taken along C-C in FIG. 4, a hetero semiconductor driving region 11 contacting a heterojunction driving end a3 other than the convex corner can be formed in the hetero semiconductor region 3 in the semiconductor chip 102. That is, in a portion contacting the heterojunction driving end a3 other than the convex corner in the hetero semiconductor region 3, a hetero semiconductor driving region 11 of which at least one of the conductivity type and the impurity density is different from those of the hetero semiconductor region 3 is formed. In a portion contacting the heterojunction driving end a4 at the convex corner, a hetero semiconductor corner region 12 of which the conductivity type and the impurity density are the same as those of the hetero semiconductor region 3 is formed. For example, when the hetero semiconductor driving region 11 is N$^+$-type of which the impurity density is higher than that of the hetero semiconductor region 3, even if the conductivity type of the hetero semiconductor corner region 12 is N-type, the same as that of the hetero semiconductor region 3, the hetero semiconductor corner region 12 is higher in energy barrier than the hetero semiconductor driving region 11 and larger in resistance due to its small impurity density. The current concentration at the convex corner can be decreased. That is, it can be possible to use a method for creating the hetero semiconductor driving region 11, which is the current-concentration relief region that keeps the reverse bias current from concentrating on the convex corner, in a portion other than at the convex corner. Even in this case, the effect of the present invention can be obtained.

Thus, according to the second embodiment, as the current-concentration relief region, the hetero semiconductor driving region 11 contacting the heterojunction driving end a3 other than the convex corner is formed in the hetero semiconductor region 3. The energy barrier for the conduction electron, formed at the heterojunction interface between the hetero semiconductor driving region 11 and the drift region 2 is lowered than the energy barrier formed at the heterojunction interface between the hetero semiconductor corner region 12 (hetero semiconductor region 3) and the drift region 2. To this end, the hetero semiconductor driving region 11 can be a conductivity type opposite to that of the hetero semiconductor corner region 12 (hetero semiconductor region 3). The resistance of the hetero semiconductor driving region 11 is decreased than that of the hetero semiconductor corner region 12 (hetero semiconductor region 3). To this end, the impurity density of the hetero semiconductor driving region 11 can be decreased than that of the hetero semiconductor corner region 12 (hetero semiconductor region 3).

Third Embodiment

A semiconductor device according to a third embodiment of the present invention is described with reference to FIGS. 6, 7.

Structure

Figure 6:
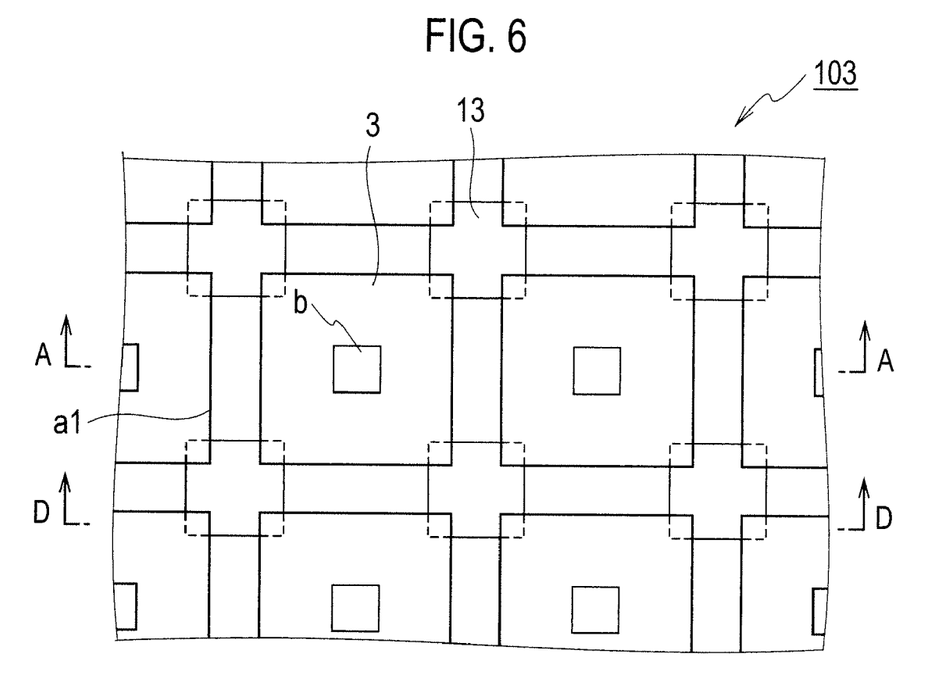
FIG. 6 is a surface view of a semiconductor device according to a third embodiment of the present invention.
Figure 7:
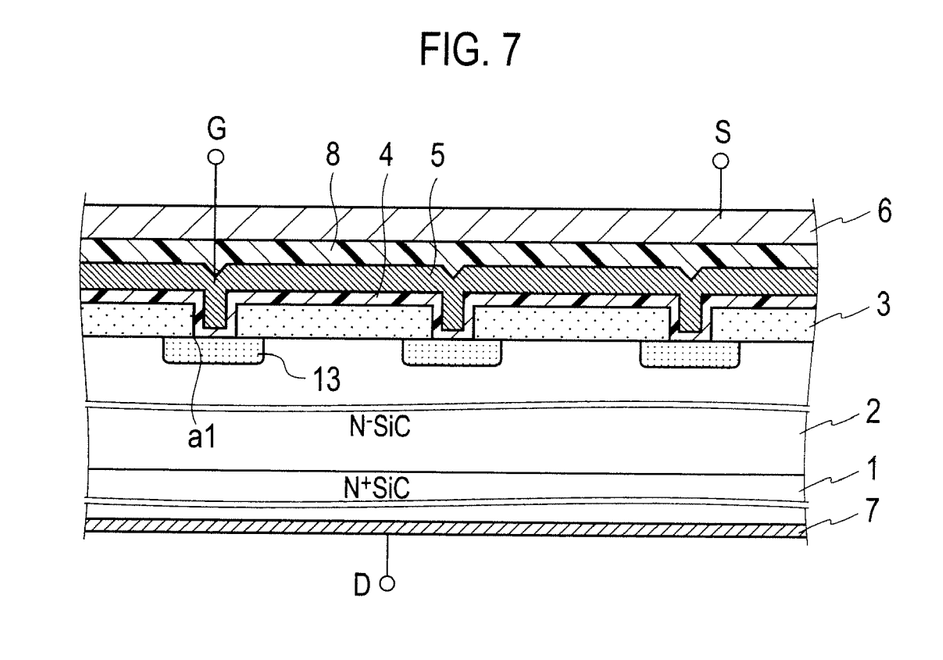
FIG. 7 is a cross-sectional view of a semiconductor device according to a third embodiment of the present invention.

As shown in FIG. 6, in the third embodiment, the surface shape of the hetero semiconductor region 3 is in a square cell shape, and the convex corner of the heterojunction driving end a1 is provided. However, a well region 13 made of silicon carbide of which the conductivity type, i.e., P-type (second conductivity type), is opposite to and the impurity density is larger than those of the drift region 2 is formed in the drift region 2 to contact the convex corner of the heterojunction driving end a1, for example. That is, as shown in FIG. 7 showing a cross-sectional structure taken along D-D in FIG. 6, in the cross-sectional structure of the four corners of the hetero semiconductor region 3, the well region 13 is formed in the drift region 2 to contact the hetero semiconductor region 3 and the gate insulating film 4, thereby configuring the heterojunction driving end a1. That is, in a portion at which a groove for the gate insulating film 4 in right and left directions in the plane of the paper of FIG. 6 in the drift region 2 and a groove for the gate insulating film 4 in up and down directions in the plane of the paper thereof intersect, the well region 13 is formed, and the corner of the hetero semiconductor region 3 and the corner of the well region 13 are superposed on the plane of the paper in FIG. 6.

Operation

The operation is described next. In the third embodiment, the semiconductor device is so used that the source electrode 6 is grounded and the drain electrode 7 is applied a positive potential, for example.

First, when the gate electrode 5 is grounded or a negative potential, for example, an interrupted state is held. This is due to the fact that at the heterojunction interface between the hetero semiconductor region 3 and the drift region 2, the energy barrier for a conduction electron is formed. At this time, in the third embodiment, the convex corners (the four corners of the hetero semiconductor region 3) of the heterojunction driving end a1 are covered with the well region 13. Thus, the applied electric field is generated at the junction surface between the well region 13 and the drift region 2, and the electric field is not applied to the convex corner. Thus, a large leakage current is not generated. That is, even when a semiconductor chip 103 structure is adopted, the interruption characteristic provided in the base cell shown in FIG. 7 can be obtained. As a result, when the structure of the third embodiment is adopted, the interrupting performance can be further improved, in contrast to a case that the well region 13 is not formed.

Subsequently, when a positive potential is applied to the gate electrode 5 to shift from the interrupted state to the conducting state, the heterojunction driving end a1 of the hetero semiconductor region 3 and the surface layer portion of the drift region 2 where the gate electric field applies via the gate insulating film 4 is formed thereon with an accumulation layer of electrons. As a result, in the hetero semiconductor region 3 and the surface layer portion of the drift region 2, a potential becomes to be the one that a free electron can be present, which makes the energy barrier extending to a side of the drift region 2 steep. Thereby, a thickness of the energy barrier is decreased. As a result, an electron current is conducted. At this time, in the third embodiment, a PN junction is formed in a path passing through the convex corner. Thus, no current is passed to the convex corner, and most of the current that passes at the time of conduction passes nearly uniformly in the base cell formed of the regions 1 to 8 arranged in plural and in parallel. As a result, in the semiconductor chip 103, the hot spot where a specific location generates heat is not easily generated. That is, in contrast to a case that the well region 13 is not formed, even when the conduction and the interruption are repeated, a specific location is not easily deteriorated. Thus, it is possible to improve a breakdown tolerance such as a short resistant load amount, and a performance about a long-term reliability as well. At the time of a reverse conduction (back-flow operation), in the third embodiment, the current does not pass to the convex corners. Most of the current that passes at the time of reverse conduction is passed nearly uniformly in the base cell structure formed of the regions 1 to 8 arranged in plural and in parallel, and thus, the current does not concentrate on a specific portion.

As described above, when the well region 13 which is the current-concentration relief region that keeps a reverse bias current from concentrating on the convex corner is arranged in the drift region 2 in a manner to contact the convex corner, it becomes possible to prevent the current concentration on the convex corner. As a result, an interrupting performance can be improved at the time of interruption, and at the same time, the generation of the hot spot in a specific portion is prevented at the time of conduction to suppress deterioration in a specific portion, thereby ensuring a long-term reliability. Further, when the semiconductor chip 103 is used in an L load circuit or the like, for example, at the time of conduction or during a transient response time to the interrupted state, in an index such as a short resistant load amount and an avalanche resistant amount, which are indexes of a breakdown tolerance when overcurrent or overvoltage occurs, the current concentration on a specific portion can be prevented. Thus, these breakdown tolerances can also be improved. The shape of the well region 13 shown in FIG. 6 is square. However, the well region in an X-letter shape can be formed. A hole can be provided in a predetermined portion of the well region. Other shapes can be selected. In any shape, as long as the well region 13 contacts at least the convex corner (the four corners of the hetero semiconductor region 3) of the heterojunction driving end a1, the effect of the present invention can be obtained.

Fourth Embodiment

A semiconductor device according to a fourth embodiment of the present invention is described with reference to FIGS. 8, 9.

Figure 8:
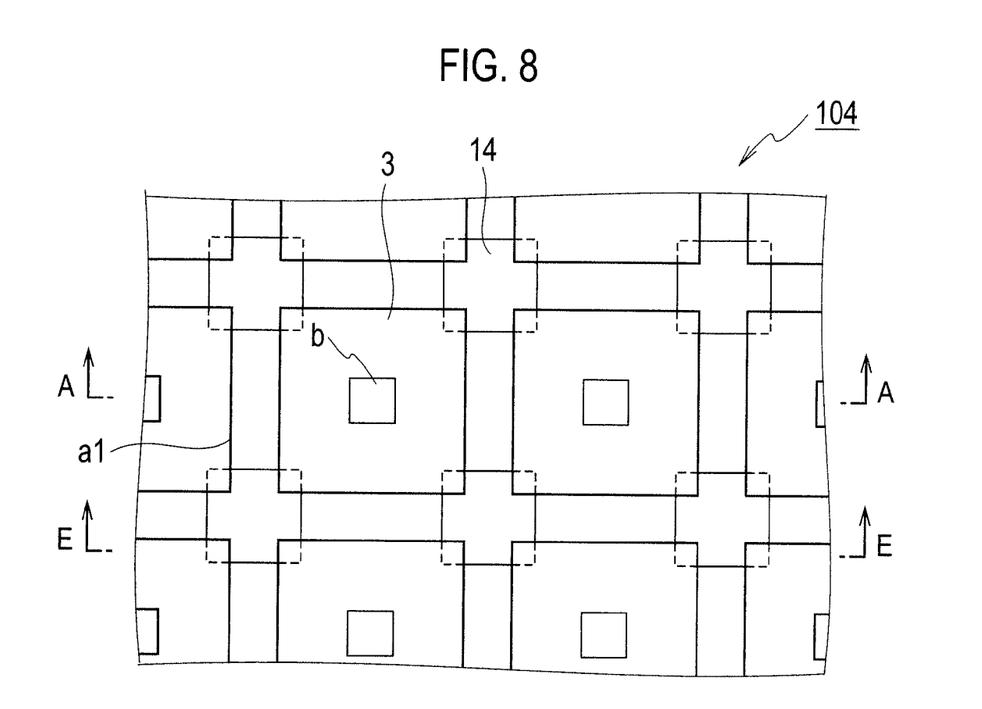
FIG. 8 is a surface view of a semiconductor device according to a fourth embodiment of the present invention.
Figure 9:
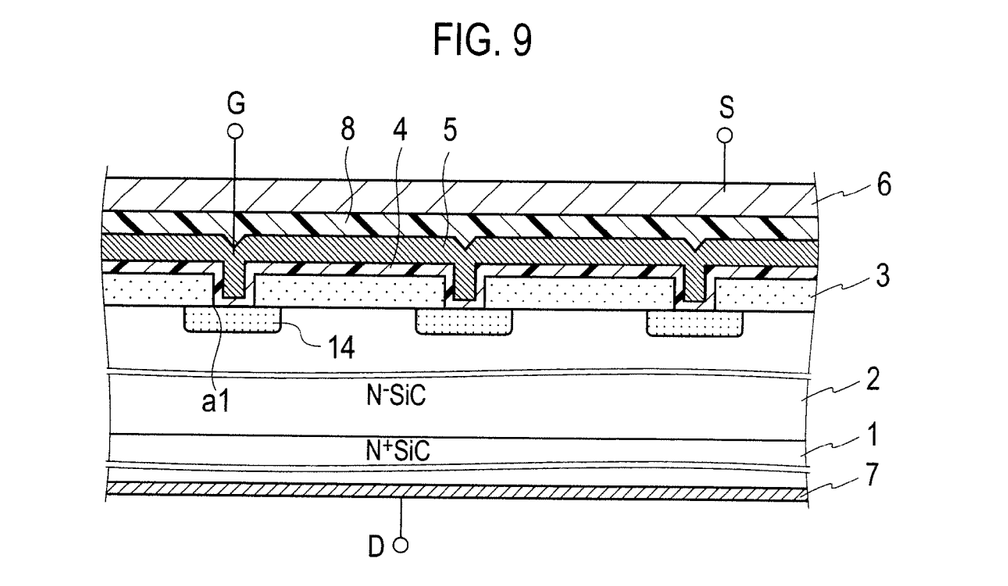
FIG. 9 is a cross-sectional view of a semiconductor device according to a fourth embodiment of the present invention.

As shown in FIG. 8 and FIG. 9 showing a cross-sectional structure taken along E-E in FIG. 8, even when a high-resistance region 14, which is formed as an inactive region by implantation of a predetermined ion in the drift region 2 and of which the conductivity is smaller than that of the drift region 2, is formed to contact the convex corner of the heterojunction driving end a1, a similar effect can be obtained. In a fourth embodiment of the present invention, for example, when ion such as boron, vanadium, and aluminum is implanted to the drift region 2 formed of silicon carbide, the high-resistance region 14 having a resistance extremely higher than those of other portions is formed in the drift region 2. That is, when the high-resistance region 14 which is the current-concentration relief region that keeps the reverse bias current from concentrating on the convex corner is arranged in the drift region 2 to contact the convex corner (four corners of the hetero semiconductor region 3) of the heterojunction driving end a1, the current concentration on the convex corner can be prevented. As a result, in a semiconductor chip 104, an interrupting performance can be improved at the time of interruption, and at the same time, the generation of the hot spot in a specific portion is prevented at the time of conduction to suppress deterioration in the specific portion, thereby ensuring a long-term reliability.

Fifth Embodiment

A semiconductor device according to a fifth embodiment of the present invention is described with reference to FIGS. 10, 11.

Figure 10:
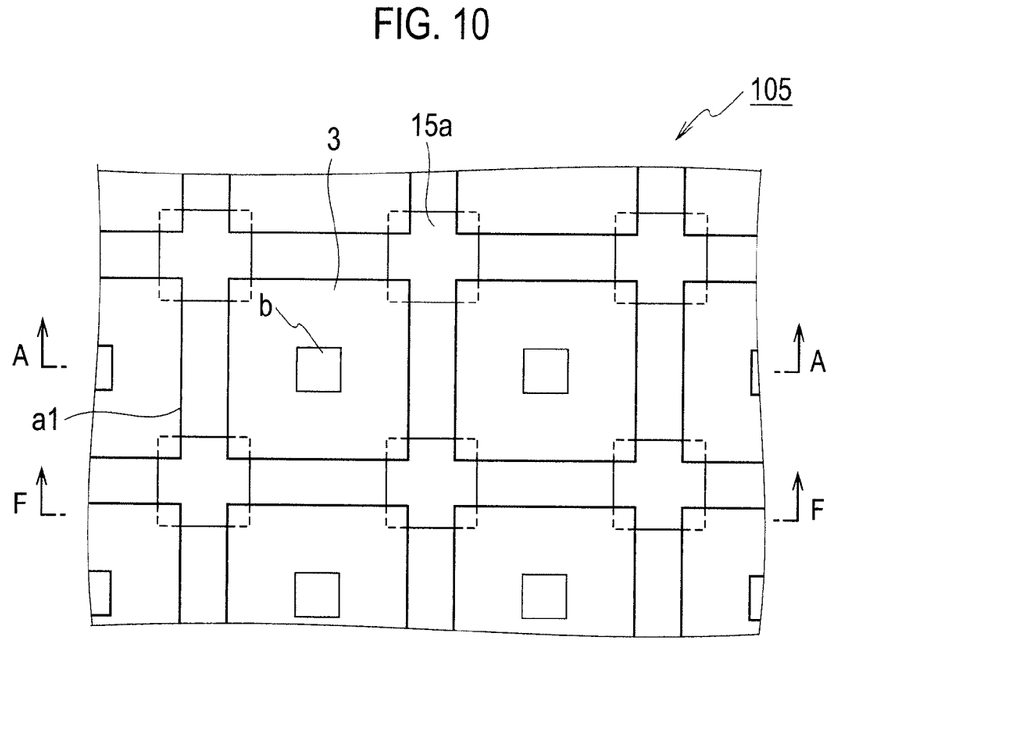
FIG. 10 is a surface view of a semiconductor device according to a fifth embodiment of the present invention.
Figure 11:
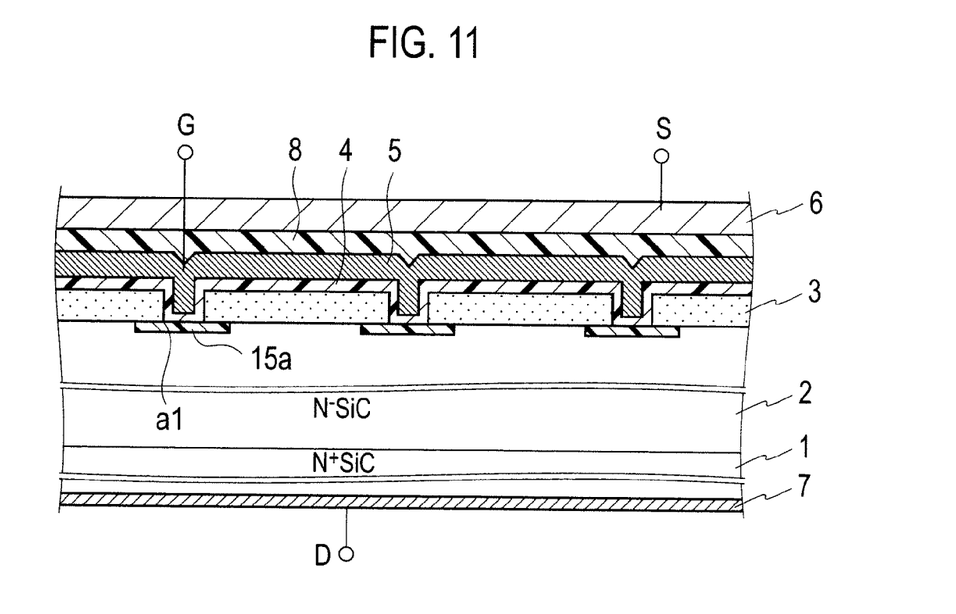
FIG. 11 is a cross-sectional view of a semiconductor device according to a fifth embodiment of the present invention.

As a fifth embodiment of the present invention, as shown in FIG. 10 and FIG. 11 showing a cross-sectional structure taken along F-F in FIG. 10, an insulating region 15a is formed in the drift region 2 to contact the convex corner of the heterojunction driving end a1. That is, in a semiconductor chip 105, between the four corners of the hetero semiconductor region 3 and the drift region 2, an insulating region 15a formed of silicon oxide film, for example, is formed. As a result of the insulating region 15a which is the current-concentration relief region that keeps a reverse bias current from concentrating on the convex corner, no current is passed between the four corners of the hetero semiconductor region 3 and the drift region 2. Thereby, the current concentration on the convex corner can be avoided, and thus, the effect of the present invention can be obtained.

Sixth Embodiment

Figure 12:
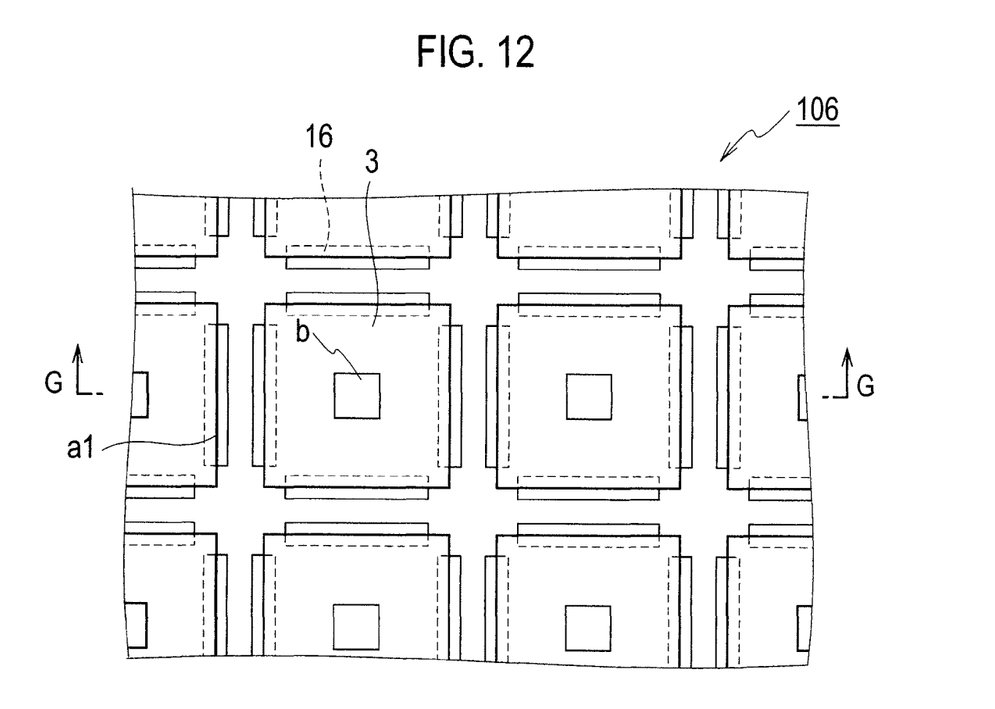
FIG. 12 is a surface view of a semiconductor device according to a sixth embodiment of the present invention.
Figure 13:
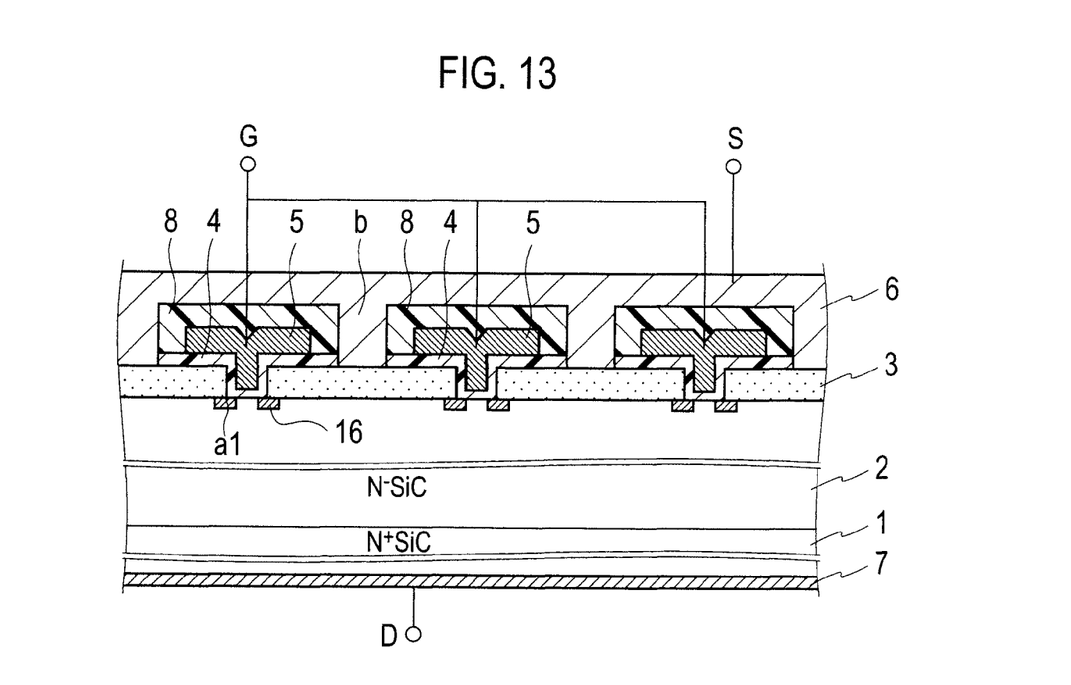
FIG. 13 is a cross-sectional view of a semiconductor device according to a sixth embodiment of the present invention.

A semiconductor device according to a sixth embodiment of the present invention is described with reference to FIGS. 12, 13.

In the third to fifth embodiments, a case that the current-concentration relief region is formed in the drift region 2 in a manner to contact the convex corner of the heterojunction driving end a1 (four corners of the hetero semiconductor region 3) has been exemplified for description. Meanwhile, as a sixth embodiment of the present invention, for example, as shown in FIG. 12 and FIG. 13 showing a cross-sectional structure taken along G-G in FIG. 12, even when a conductive region 16, of which the conductivity type is the same as and the impurity density is larger than that of the drift region 2, is formed to contact the heterojunction driving end a1 other than the convex corner, the effect of the present invention can be obtained. That is, in a semiconductor chip 106, the conductive region 16 which is the current-concentration relief region that keeps a reverse bias current from concentrating on the convex corner is formed in a manner to contact the heterojunction driving end a1 other than the convex corner. Thereby, passing of the current in the heterojunction driving end a1 other than the convex corner is increased to relatively decrease the current in the convex corner in the heterojunction driving end a1. As a result, the current concentration in the convex corner can be decreased.

Seventh Embodiment

Figure 14:
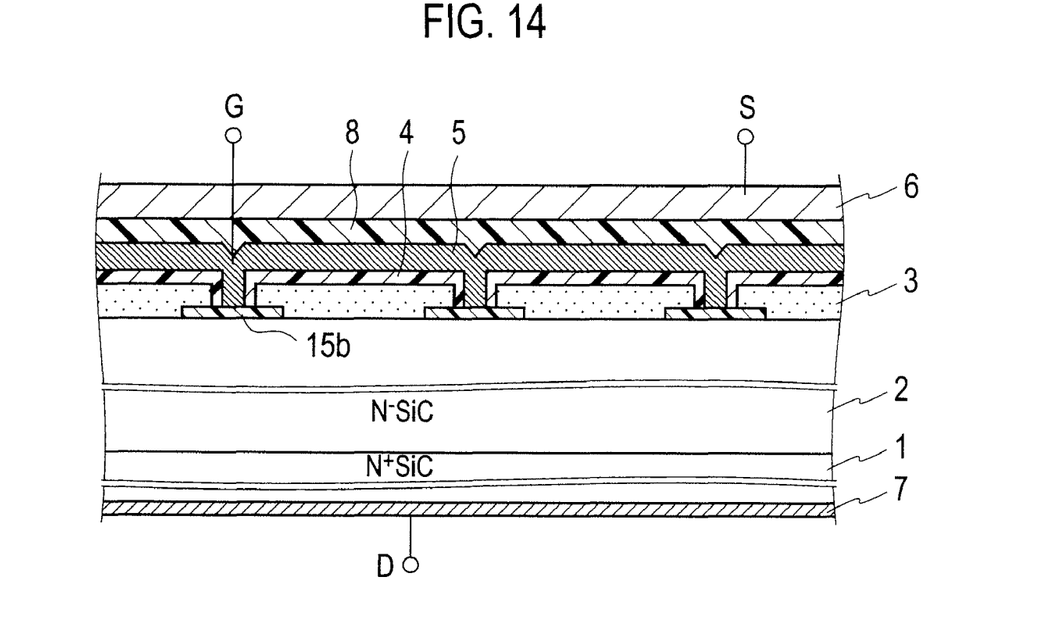
FIG. 14 is a cross-sectional view of a semiconductor device according to a seventh embodiment of the present invention.

A semiconductor device according to a seventh embodiment of the present invention is described with reference to FIG. 14.

In the fifth embodiment, the insulating region 15a is formed within the drift region 2. Meanwhile, as a seventh embodiment of the present invention, as shown in FIG. 14 showing a cross-sectional structure similar to that in FIG. 11, the insulating region 15b can be formed on the drift region 2 in a manner to contact the convex corner of the heterojunction driving end a1. That is, between the four corners of the hetero semiconductor region 3, and the drift region 2, an insulating region 15b formed of a silicon oxide film, for example, is formed. A surface structure of the seventh embodiment is similar to that in FIG. 10. As a result of the insulating region 15b which is the current-concentration relief region that keeps a reverse bias current from concentrating on the convex corner, no current is passed between the four corners of the hetero semiconductor region 3, and the drift region 2. Thereby, the current concentration on the convex corner can be avoided, and thus, the effect of the present invention can be obtained.

Other Embodiments

Figure 15:
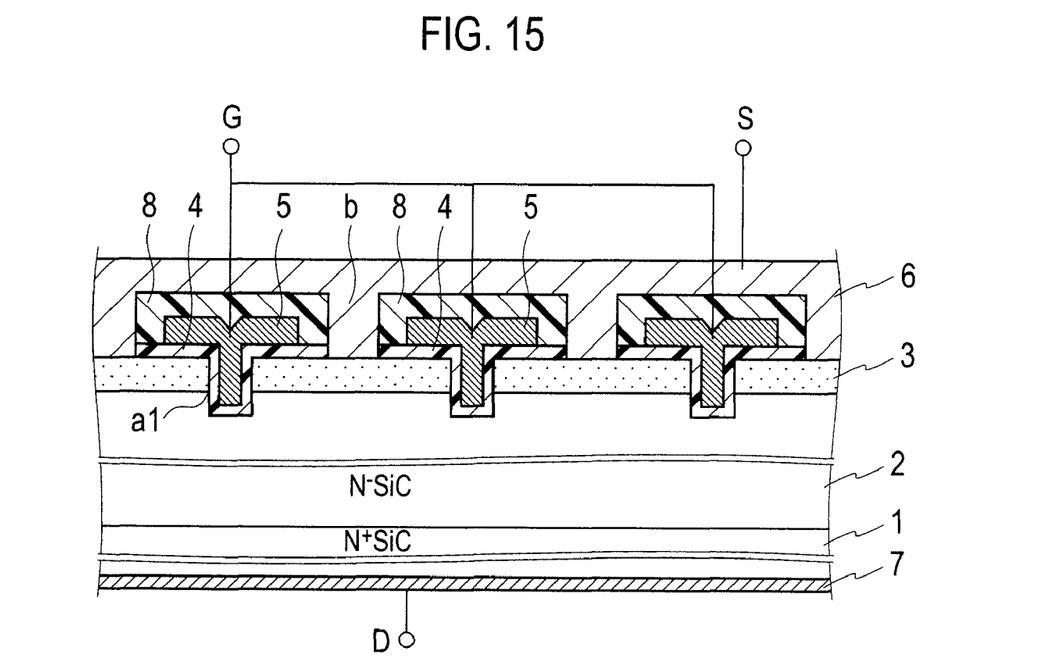
FIG. 15 is a cross-sectional view of a semiconductor device according to other embodiment of the present invention.

Thus, in the first to seventh embodiments, to describe the characteristics of the present invention in an understandable manner, a minimum configuration is used to describe the base cell structure. However, in the present invention, as long as the current concentration caused in at least one portion of the heterojunction driving end a1 can be relieved at the time of interruption and conduction, even when any structure is added as the semiconductor device or even when the semiconductor device is modified in any shape, the similar effect can be obtained. For example, in the cross-sectional structures of the hetero semiconductor region 3 shown in the first to seventh embodiments, a case that side surfaces, i.e., up-and-down-direction surfaces in the plane of paper of FIG. 14, of the hetero semiconductor region 3 forms a right angle relative to a surface of the drift region 2 is described. However, the side surfaces of the hetero semiconductor region 3 can form an acute angle or an obtuse angle relative to the surface of the drift region 2. In the first to seventh embodiments, a case of a so-called planar type in which the gate electrode 5 is formed without drilling the drift region 2 is described. However, for example, as shown in FIG. 15, a so-called trench type in which the drift region 2 is drilled can be selected.

Figure 16:
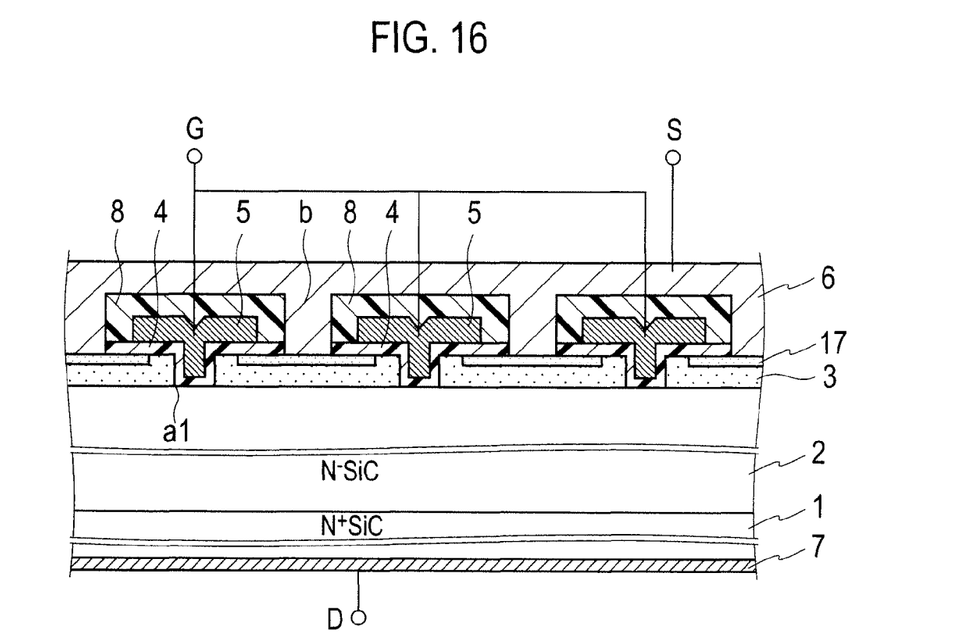
FIG. 16 is a cross-sectional view of a semiconductor device according to other embodiment of the present invention.
Figure 17:
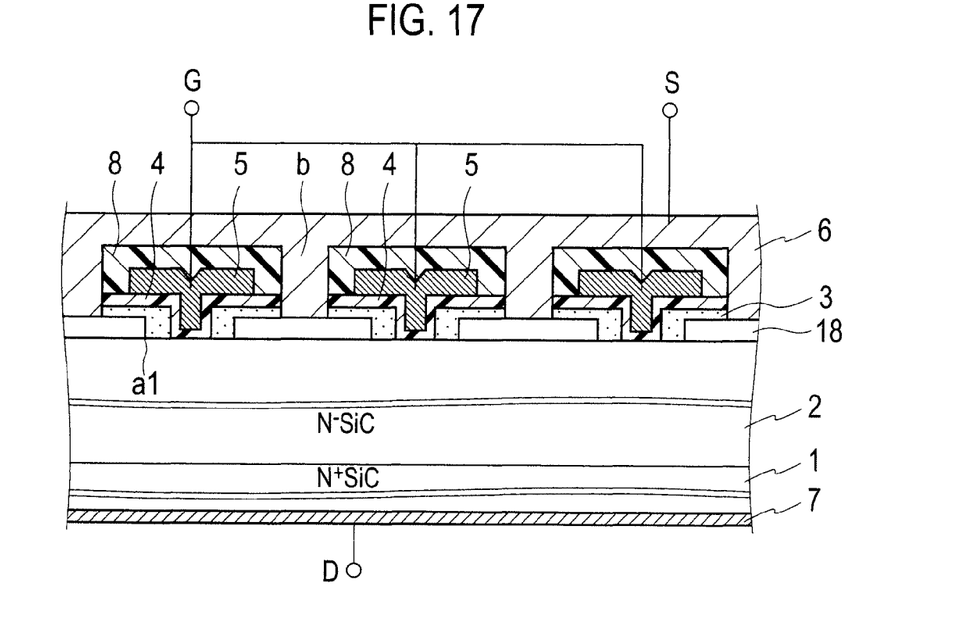
FIG. 17 is a cross-sectional view of a semiconductor device according to other embodiment of the present invention.

In FIG. 1, which exemplifies as the base cell, a case that the hetero semiconductor region 3 is configured by a single impurity region is shown. However, as shown in FIG. 16 and FIG. 17, the hetero semiconductor region 3 can be configured by a plurality of impurity regions. That is, as shown in FIG. 16, when an $N^+$-type contact region 17 of which the conductivity type is the same as and the impurity density is higher than that of the hetero semiconductor region 3 is formed on the surface of the hetero semiconductor region 3, the conduction performance of the base cell is improved, and at the same time, a resistance difference between a central portion of the surface shape of the hetero semiconductor region 3 and the four corners thereof can be increased, and thus, the current-concentration relief effect in the convex corner can be further enhanced. Furthermore, as shown in FIG. 17, a $P^+$-type second hetero semiconductor region 18, of which the conductivity type is opposite to and the impurity density is higher than those of the hetero semiconductor region 3, is formed in the hetero semiconductor region 3 apart from the gate insulating film 4, the interrupting performance of the base cell is improved, and at the same time, as the semiconductor chip, a leakage current can be further decreased.

Figure 18:
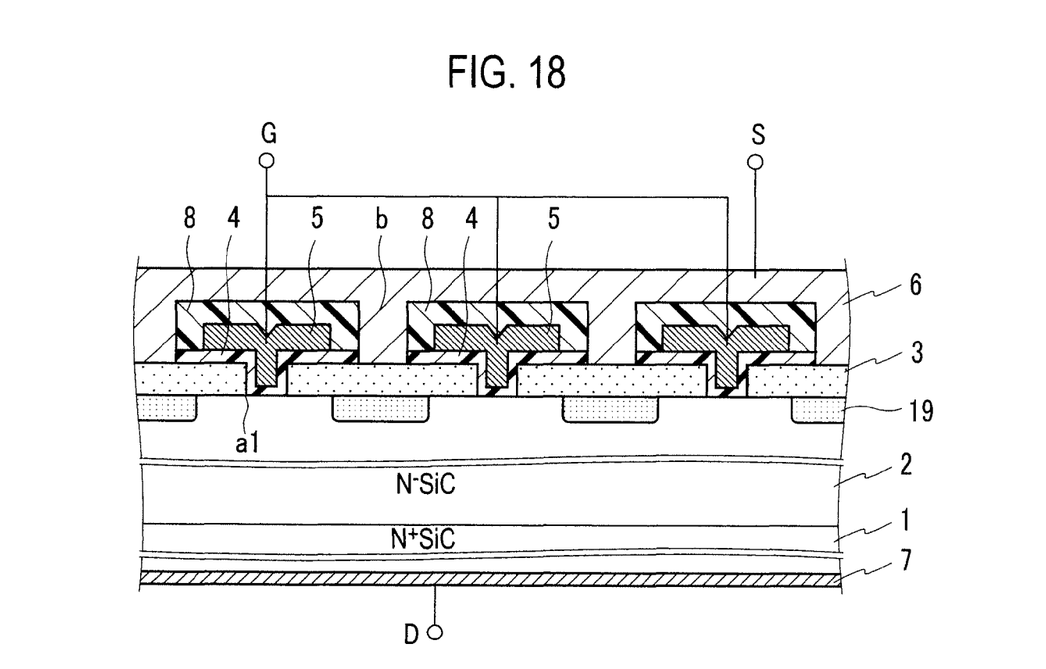
FIG. 18 is a cross-sectional view of a semiconductor device according to other embodiment of the present invention.
Figure 19:
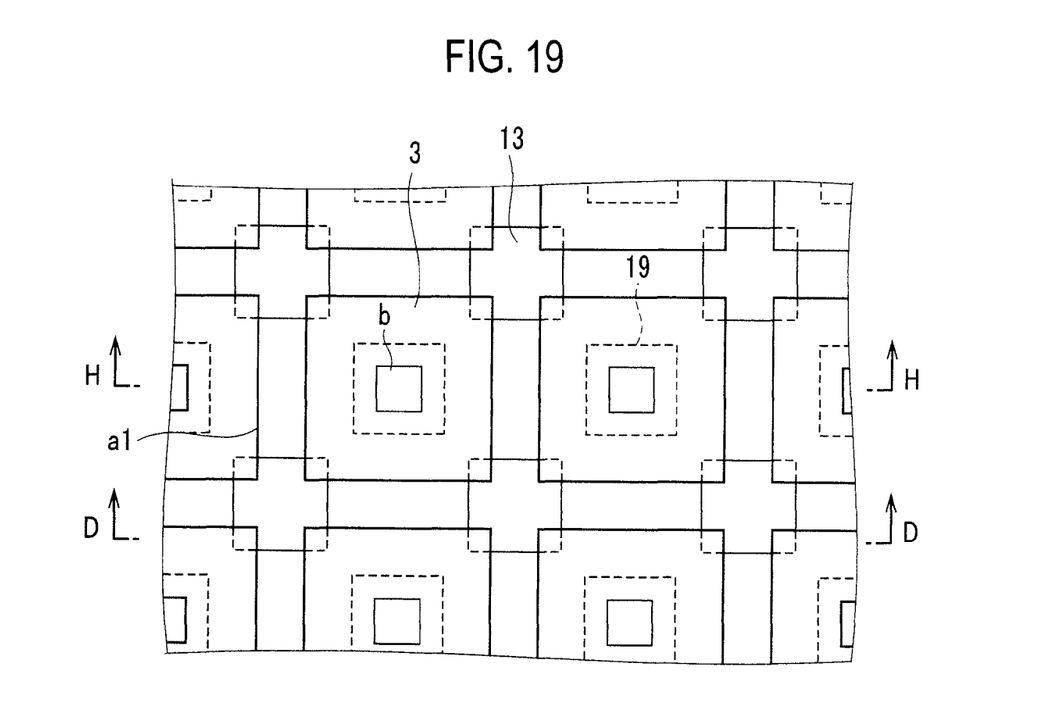
FIG. 19 is a surface view of a semiconductor device according to other embodiment of the present invention.
Figure 20:
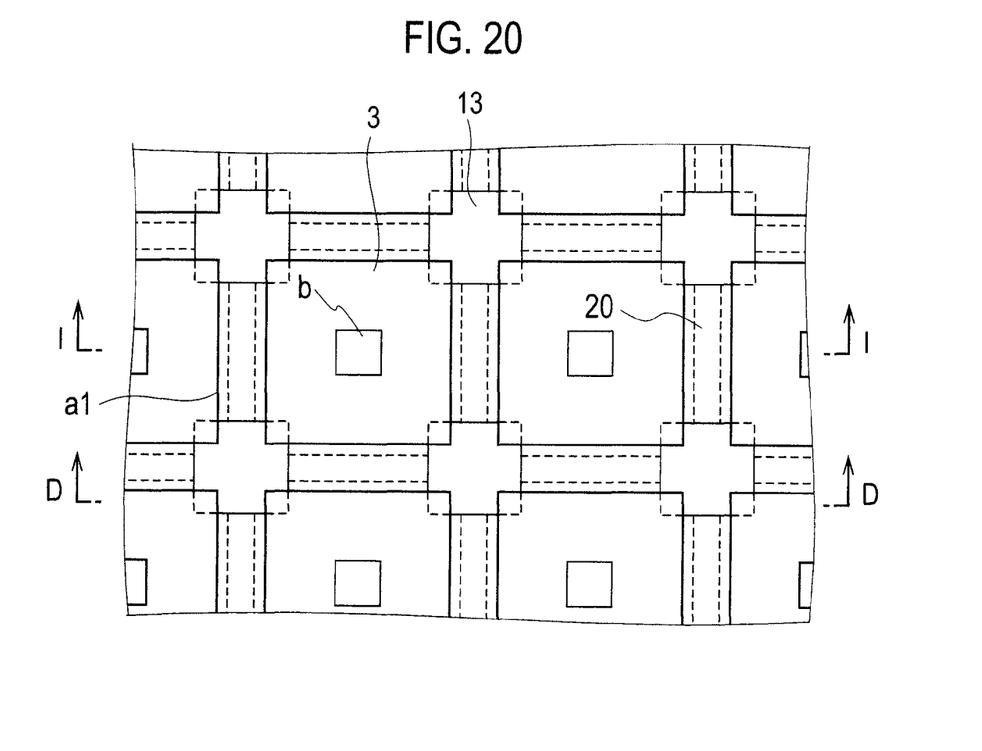
FIG. 20 is a surface view of a semiconductor device according to other embodiment of the present invention.
Figure 21:
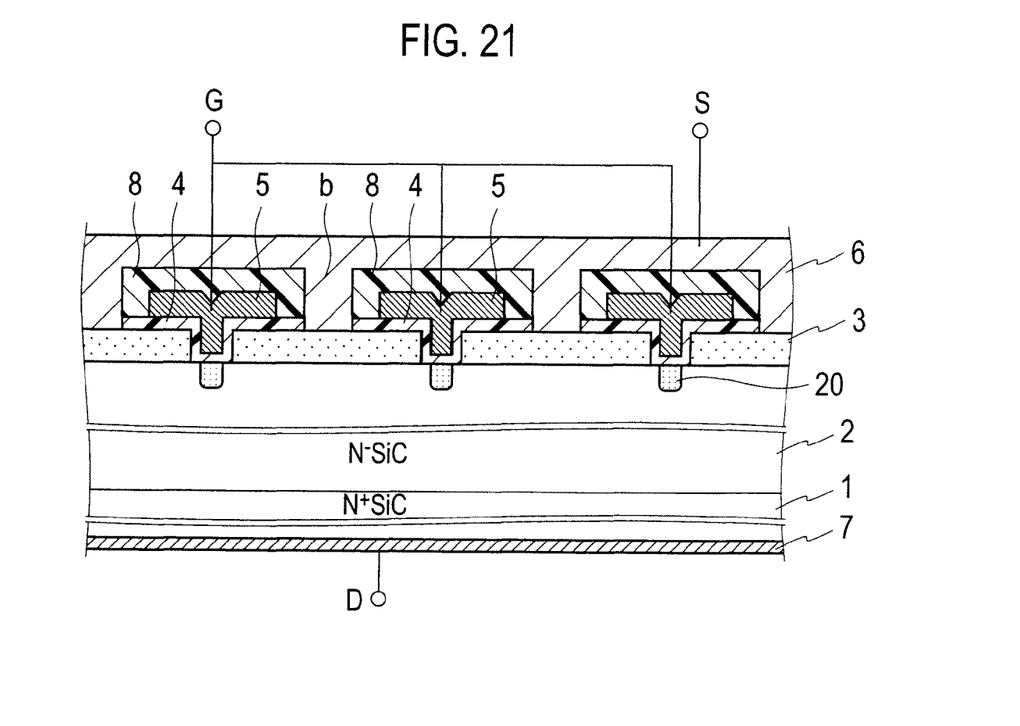
FIG. 21 is a cross-sectional view of a semiconductor device according to other embodiment of the present invention.

Further, in the drift region 2 of the base cell structure, the current-concentration relief region can be formed. That is, as shown in FIG. 18, a well region 19 can be formed in the drift region 2 in a manner to contact the hetero semiconductor region 3, for example. At this time, for example, similarly to the third embodiment, the well region 13 is formed in the drift region 2, as shown in FIG. 19. In this case, in respective predetermined portions of the hetero semiconductor 3, well regions 13 and 19 can be formed by the same process. A cross-sectional structure taken along H-H in FIG. 19 is a cross-sectional shape shown in FIG. 18. A cross-sectional structure taken along D-D in FIG. 19 is similar to the cross-sectional structure shown in FIG. 7 described in the third embodiment (the same applies to those in FIG. 19 and FIG. 21). Thereby, the current concentration in the convex corner of the heterojunction driving end a1 (four corners of the hetero semiconductor region 3) can be suppressed, and at the same time, the interruption characteristic of the current in the base cell can be further improved. Thus, a performance as the semiconductor chip can be further improved. In FIG. 18 and FIG. 19, the well region 19 is formed to contact the hetero semiconductor region 3. However, as shown in FIG. 20 and FIG. 21 showing a cross-sectional structure taken along I-I in FIG. 20, the well region 20 can be formed to contact the gate insulating film 4. In any structure or in any combined shape, in addition to exhibiting the effect of the present invention, the interrupting performance can be further improved.

Figure 22:
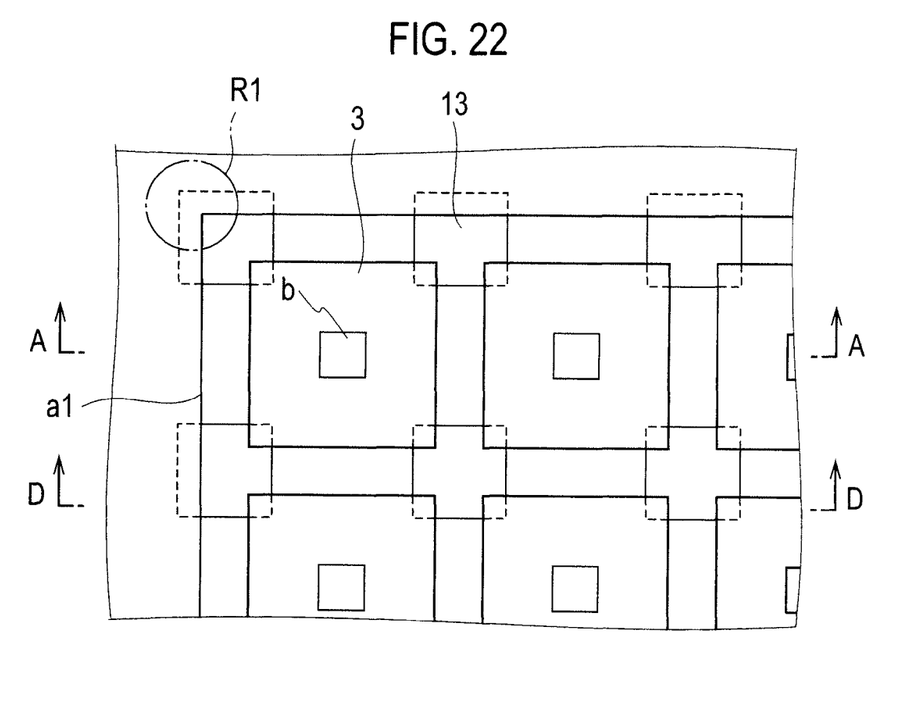
FIG. 22 is a surface view of a semiconductor device according to other embodiment of the present invention.
Figure 23:
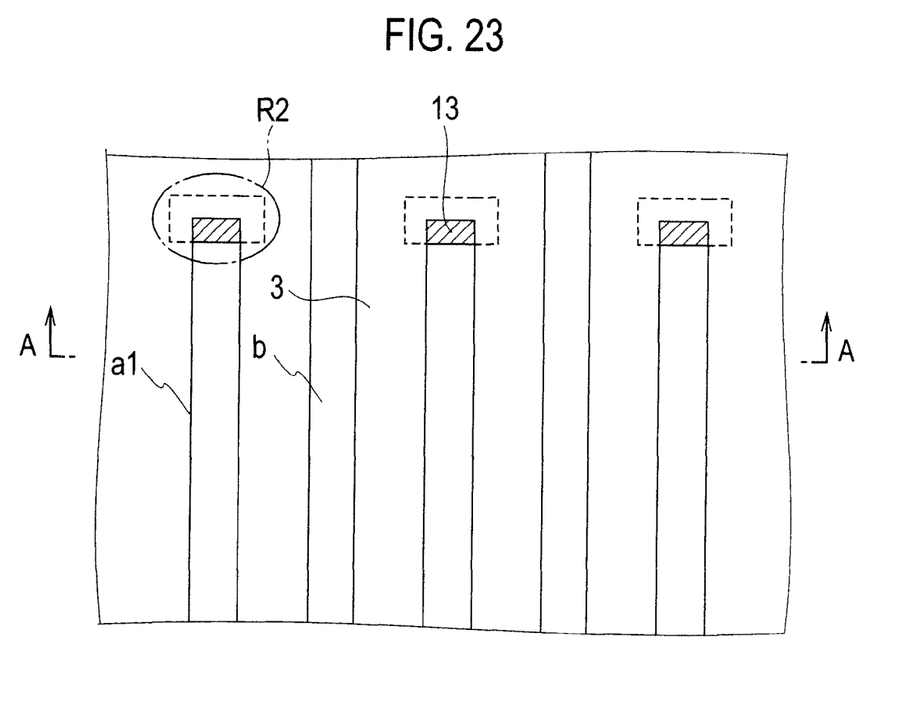
FIG. 23 is a surface view of a semiconductor device according to other embodiment of the present invention.

Thus, a measure for relieving the current concentration occurring concurrently with the surface shape of the hetero semiconductor region 3 and the effect obtained thereby are described using the examples in FIG. 1 to FIG. 21. When the configurations shown in the first to seventh embodiments are used, the current concentration not only in the convex corner of the heterojunction driving end a1 but also in a concave corner of the hetero semiconductor region 3 as shown in FIG. 22 and FIG. 23, for example, can be relieved. That is, the well region 13 is formed to contact the concave corner of the outermost hetero semiconductor region 3 in which the square cell shapes are repeatedly arranged, shown in a region R1 in FIG. 22, for example, and the well region 13 is formed to contact the concave corner of the outermost heterojunction driving end a1 in a stripe shape, shown in a region R2 in FIG. 23, for example. Thereby, as the surface shape of the hetero semiconductor region 3, it is possible not to allow the current to pass to a portion having a curvature or a corner different from that in other portions.

In the first to seventh embodiments, as one example of the cell shape, a case of the square cell shape is shown for description. However, as long as a convex corner of the heterojunction driving end a1 such as a hexagonal cell shape and a circle cell shape, or a surface arrangement having a concave corner is adopted, any shape can provide the effect of the present invention. In the first to seventh embodiments, as the convex corner, a case of the right-angle shape is exemplified. However, even in a case of an acute-angle shape and obtuse-angle shape, and further a curved shape having a predetermined curvature, the effect of the present invention can be obtained. In each of the first to seventh embodiments, while measures for relieving the current concentration in a predetermined portion of the hetero semiconductor region 3 are individually shown, these measures can be used in combination.

Description has been made of the embodiments to which the invention created by the inventors of the present invention is applied. However, the present invention is not limited to the descriptions and the drawings, which form a part of the disclosure of the present invention according to these embodiments. For example, in the first to seventh embodiments, while the semiconductor device of which the substrate material is silicon carbide is described as one example, the substrate material can be other semiconductor materials such as gallium nitride and diamond. The first to seventh embodiments are described by using 4H type as the polytype of silicon carbide. However, other polytypes such as 6H and 3C can be selected. The first to seventh embodiments are described by using a so-called vertically structured transistor in which the drain electrode 7 and the source electrode 6 are arranged to be opposite to each other in a manner to sandwich the drift region 2 therebetween and the current is passed vertically. However, a so-called horizontally structured transistor in which for example, the drain electrode 7 and the source electrode 6 are arranged on the same main surface and the current is passed in a horizontal direction can also be selected.

For the material used for the hetero semiconductor region 3, an example using the polycrystalline silicon is described. However, as long as a material forming hetero junction with silicon carbide is used, any material including other silicon materials such as single crystal silicon and amorphous silicon, other semiconductor materials such as germanium and silicon germane, and other polytypes of silicon carbide such as 6H and 3C can be selected. The present invention is described by using, as one example, the N-type silicon carbide as the drift region 2 and the N-type polycrystalline silicon as the hetero semiconductor region 3. However, for these regions, any combination of N-type silicon carbide and P-type polycrystalline silicon, that of P-type silicon carbide and P-type polycrystalline silicon, and that of P-type silicon carbide and N-type polycrystalline silicon can be selected. Thus, all of other embodiments, examples, operational techniques and the like, which are made by those skilled in the art based on these embodiments, are naturally incorporated in the scope of the present invention.

The entire content of Japanese Patent Application No. TOKUGAN 2007-313110 with a filing date of Dec. 4, 2007, and Japanese Patent Application No. TOKUGAN 2008-255061 with a filing date of Sep. 30, 2008 is hereby incorporated by reference.

What is claimed is:

1. A semiconductor device comprising:
   a semiconductor body of a first conductivity type;
   a hetero semiconductor region having a band gap width different from that of the semiconductor body and contacting with the semiconductor body to form a heterojunction interface;
   a gate electrode contacting with the heterojunction interface via a gate insulating film;
   a source electrode connected to the hetero semiconductor region; and
   a drain electrode connected to the semiconductor body;
   a corner provided at the heterojunction interface contacting the gate insulating film; and
   a current-concentration relief region decreasing current flowing at the corner than current flowing at the other heterojunction interface position contacting the gate insulating film.

2. The semiconductor device according to claim 1, wherein the current-concentration relief region is formed in the hetero semiconductor region.

3. The semiconductor device according to claim 2, wherein the current-concentration relief region is a corner region of the hetero semiconductor region contacting the corner.

4. The semiconductor device according to claim 3, wherein an energy barrier for an electron, formed at a heterojunction interface between the corner and the semiconductor body is higher than an energy barrier formed at the other heterojunction interface position.

5. The semiconductor device according to claim 3, wherein a resistance of the hetero semiconductor corner region is larger than a resistance of the other hetero semiconductor region.

6. The semiconductor device according to claim 2, wherein the current-concentration relief region is formed in a hetero semiconductor region that contacts the other heterojunction interface position.

7. The semiconductor device according to claim 6, wherein an energy barrier for a conduction electron, formed at a heterojunction interface between the hetero semiconductor region that contacts the other heterojunction interface position and the semiconductor body is lower than an energy barrier formed at the other heterojunction interface region.

8. The semiconductor device according to claim 6, wherein a resistance of the hetero semiconductor region contacting the other heterojunction interface position is smaller than a resistance of the other hetero semiconductor region.

9. The semiconductor device according to claim 1, wherein the current-concentration relief region is formed in the semiconductor body.

10. The semiconductor device according to claim 9, wherein the current-concentration relief region is formed in the semiconductor body in a manner to contact the corner.

11. The semiconductor device according to claim 10, wherein the current-concentration relief region is a well region of a second conductivity type.

12. The semiconductor device according to claim 10, wherein the current-concentration relief region is a high-resistance region having a small conductivity than that of the semiconductor body.

13. The semiconductor device according to claim 10, wherein the current-concentration relief region is an insulating region.

14. The semiconductor device according to claim 9, wherein the current-concentration relief region is formed in the semiconductor body in a manner to contact the other heterojunction interface position.

15. The semiconductor device according to claim 14, wherein the current-concentration relief region is a conductive region, of the same conductivity type as and having an impurity density higher than those of the semiconductor body.

16. The semiconductor device according to claim 1, wherein the current-concentration relief region is formed on the semiconductor body.

17. The semiconductor device according to claim 16, wherein the current-concentration relief region is formed on the semiconductor body in a manner to contact the corner.

18. The semiconductor device according to claim 17, wherein the current-concentration relief region is an insulating region.

19. The semiconductor device according to claim 1, wherein the semiconductor body is formed of silicon carbide.

20. The semiconductor device according to claim 1, wherein the hetero semiconductor region comprises at least one of single crystal silicon, amorphous silicon, and polycrystalline silicon.

* * * * *